United States Patent
Gai et al.

(10) Patent No.: US 10,249,613 B2
(45) Date of Patent: Apr. 2, 2019

(54) ELECTROSTATIC DISCHARGE DEVICE AND MANUFACTURING METHOD THEREOF, ARRAY SUBSTRATE, DISPLAY PANEL AND DEVICE

(71) Applicant: Boe Technology Group Co., Ltd., Beijing (CN)

(72) Inventors: Cuili Gai, Beijing (CN); Longyan Wang, Beijing (CN); Ling Wang, Beijing (CN); Quanhu Li, Beijing (CN); Yi-cheng Lin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/736,753

(22) PCT Filed: May 15, 2017

(86) PCT No.: PCT/CN2017/084354
§ 371 (c)(1),
(2) Date: Dec. 14, 2017

(87) PCT Pub. No.: WO2018/014640
PCT Pub. Date: Jan. 25, 2018

(65) Prior Publication Data
US 2018/0358353 A1    Dec. 13, 2018

(30) Foreign Application Priority Data

Jul. 22, 2016  (CN) .......................... 2016 1 0584181

(51) Int. Cl.
*H01L 21/77*  (2017.01)
*H01L 27/02*  (2006.01)
(Continued)

(52) U.S. Cl.
CPC .... *H01L 27/0266* (2013.01); *H01L 21/76877* (2013.01); *H01L 21/77* (2013.01);
(Continued)

(58) Field of Classification Search
CPC ........... H01L 27/0266; H01L 21/76877; H01L 27/0288; H01L 27/1255; H01L 28/40;
(Continued)

(56) References Cited

U.S. PATENT DOCUMENTS 9,443,983 B2 * 9/2016 Sun .................... G02F 1/1368
2005/0078264 A1  4/2005 Yoo et al.
(Continued)

FOREIGN PATENT DOCUMENTS

CN       101201514 A    6/2008
CN       102916032 A    2/2013
(Continued)

OTHER PUBLICATIONS

Written Opinion received for PCT Patent Application No. PCT/CN2017/084354, dated Aug. 25, 2017, 6 pages (2 pages of English Translation and 4 pages of Original Document).
(Continued)

*Primary Examiner* — Fernando L Toledo
*Assistant Examiner* — Neil R Prasad
(74) *Attorney, Agent, or Firm* — Womble Bond Dickinson (US) LLP

(57) ABSTRACT

An electrostatic discharge device comprises a transistor with one of its source and drain serving as an input terminal of said device and the other serving as an output terminal. Said transistor comprises: a first conductive layer used as a first floating gate; a first insulating layer covering said first conductive layer; an active layer on said first insulating layer; a second insulating layer covering said active layer; a second conductive layer used as a second floating gate and
(Continued)

on said second insulating layer; a third insulating layer covering said second conductive layer; a third conductive layer and a fourth conductive layer on said third insulating layer and on both sides of the active layer, said third conductive layer being isolated from the fourth conductive layer, wherein said third conductive layer serves as one of the source and the drain and said fourth conductive layer serves as the other.

20 Claims, 14 Drawing Sheets

(51) Int. Cl.
*H01L 27/12* (2006.01)
*H01L 29/788* (2006.01)
*H01L 29/66* (2006.01)
*H01L 49/02* (2006.01)
*H01L 21/768* (2006.01)
*H01L 29/786* (2006.01)

(52) U.S. Cl.
CPC .......... *H01L 27/02* (2013.01); *H01L 27/0288* (2013.01); *H01L 27/1255* (2013.01); *H01L 28/40* (2013.01); *H01L 29/66484* (2013.01); *H01L 29/788* (2013.01); *H01L 29/78648* (2013.01)

(58) Field of Classification Search
CPC ......... H01L 29/66484; H01L 29/78648; H01L 29/788
See application file for complete search history.

(56) References Cited

U.S. PATENT DOCUMENTS

| | | |
|---|---|---|
| 2008/0136986 A1 | 6/2008 | Kim et al. |
| 2009/0102751 A1 | 4/2009 | Takatoku |
| 2013/0032804 A1 | 2/2013 | Kim et al. |
| 2016/0071834 A1 | 3/2016 | Zhang et al. |
| 2016/0307988 A1* | 10/2016 | Kim ............... H01L 27/3262 |
| 2017/0117265 A1 | 4/2017 | Chai |

FOREIGN PATENT DOCUMENTS

| | | |
|---|---|---|
| CN | 103117285 A | 5/2013 |
| CN | 103268876 A | 8/2013 |
| CN | 104064516 A | 9/2014 |
| CN | 104300009 A | 1/2015 |
| CN | 104749844 A | 7/2015 |
| CN | 105308752 A | 2/2016 |
| CN | 106024781 A | 10/2016 |

OTHER PUBLICATIONS

Office Action received for Chinese Patent Application No. 201610584181.6, dated Jun. 4, 2018, 17 pages (9 pages of English Translation and 8 pages of Office Action).

International Search Report received for PCT Patent Application No. PCT/CN2017/084354, dated Aug. 25, 2017, 6 pages (2 pages of English Translation and 4 pages of Original Document).

Office Action received for Chinese Patent Application No. 201610584181.6, dated Nov. 13, 2018, 16 pages (9 pages of English Translation and 7 pages of Office Action).

International Preliminary Report on Patentability received for PCT Patent Application No. PCT/CN2017/084354, dated Jan. 31, 2019, 11 pages (6 pages of English Translation and 5 pages of Original Document).

\* cited by examiner

ELECTROSTATIC DISCHARGE DEVICE AND MANUFACTURING METHOD THEREOF, ARRAY SUBSTRATE, DISPLAY PANEL AND DEVICE

RELATED APPLICATIONS

The present application is the U.S. national phase entry of PCT/CN2017/084354, with an international filing date of May 15, 2017, which claims the benefit of Chinese Patent Application No. 201610584181.6, filed on Jul. 22, 2016, the entire disclosures of which are incorporated herein by reference.

TECHNICAL FIELD

The present disclosure relates to electrostatic discharge (ESD) protection, in particular to an electrostatic discharge device, a manufacturing method thereof, and an active array substrate, a display panel and a display device.

BACKGROUND

In a display device, electrostatic discharge devices are usually provided for components like the display panel so as to prevent them from being damaged by static electricity.

As the resolutions of products become higher and higher, and pixels of products are designed smaller and smaller, the spaces of ESD design units around the display areas become smaller and smaller. However, the electrostatic discharge device in the prior art occupies a large space and the electrostatic discharge capability needs to be further enhanced.

SUMMARY

One of the objects of the present disclosure is to provide an electrostatic discharge device.

A first aspect of the present disclosure provides an electrostatic discharge device, which comprises: a transistor with one of its source and drain serving as an input terminal of said electrostatic discharge device and the other of its source and drain serving as an output terminal of said electrostatic discharge device, wherein said transistor comprises: a first conductive layer used as a first floating gate; a first insulating layer covering said first conductive layer; an active layer disposed on said first insulating layer; a second insulating layer covering said active layer; a second conductive layer used as a second floating gate and disposed on said second insulating layer; a third insulating layer covering said second conductive layer; and a third conductive layer and a fourth conductive layer disposed on said third insulating layer and on both sides of the active layer, said third conductive layer and fourth conductive layer being isolated from each other; wherein said third conductive layer serves as one of the source and the drain and said fourth conductive layer serves as the other of the source and the drain; said first conductive layer, said third conductive layer, and said first insulating layer, second insulating layer and third insulating layer disposed between said first conductive layer and said third conductive layer form a first capacitor; said first conductive layer, said fourth conductive layer, and said first insulating layer, second insulating layer and third insulating layer disposed between said first conductive layer and said fourth conductive layer form a second capacitor; said second conductive layer, said third conductive layer, and said third insulating layer disposed between said second conductive layer and said third conductive layer form a third capacitor; said second conductive layer, said fourth conductive layer, and said third insulating layer disposed between said second conductive layer and said fourth conductive layer form a fourth capacitor.

In one embodiment, said first conductive layer and said second conductive layer are electrically connected to each other.

In one embodiment, said transistor further comprises: a relay conductive layer disposed on said third insulating layer and isolated from said third conductive layer and said fourth conductive layer, said first conductive layer and said second conductive layer being electrically connected to said relay conductive layer through corresponding via holes.

In one embodiment, said transistor further comprises: a fourth insulating layer covering said third insulating layer, said third conductive layer and said fourth conductive layer; and a fifth conductive layer disposed on said fourth insulating layer; said fifth conductive layer, said third conductive layer and said fourth insulating layer that is disposed between said fifth conductive layer and said third conductive layer form a fifth capacitor, and said fifth conductive layer, said fourth conductive layer and said fourth insulating layer that is disposed between said fifth conductive layer and said fourth conductive layer form a sixth capacitor.

In one embodiment, at least one of said first conductive layer and said second conductive layer is electrically connected to said fifth conductive layer.

In one embodiment, said transistor further comprises: a relay conductive layer disposed on said third insulating layer and isolated from said third conductive layer and said fourth conductive layer, said fifth conductive layer and at least one of said first conductive layer and said second conductive layer are electrically connected to said relay conductive layer through corresponding via holes.

In one embodiment, said fifth conductive layer comprises an ITO layer or an Al layer.

Another object of the present disclosure is to provide an active array substrate.

A second aspect of the present disclosure provides an active array substrate which comprises the above-mentioned electrostatic discharge device.

In one embodiment, the input terminal of said electrostatic discharge device is connected to a gate line or a data line, and the output terminal of said electrostatic discharge device is grounded.

Still another object of the present disclosure is to provide a display panel.

A third aspect of the present disclosure provides a display panel which comprises the above-mentioned active array substrate.

Yet another object of the present disclosure is to provide a display device.

A fourth aspect of the present disclosure provides a display device which comprises the above-mentioned display panel.

Still another object of the present disclosure is to provide a method for manufacturing the electrostatic discharge device.

A fifth aspect of the present disclosure provides a method for manufacturing an electrostatic discharge device, wherein said electrostatic discharge device comprises a transistor with one of its source and drain serving as an input terminal of said electrostatic discharge device and the other of its source and drain serving as an output terminal of said electrostatic discharge device, and wherein said method comprises: forming a first conductive layer used as a first floating gate; forming a first insulating layer covering said first conductive layer; forming an active layer on said first insulating layer; forming a second insulating layer covering said active layer; forming a second conductive layer used as a second floating gate on said second insulating layer; forming a third insulating layer covering said second conductive layer; and forming a third conductive layer and a fourth conductive layer that are isolated from each other on said third insulating layer; wherein said third conductive layer and fourth conductive layer are on both sides of the active layer, respectively; said third conductive layer serves as one of the source and the drain and said fourth conductive layer serves as the other of the source and the drain; wherein said first conductive layer, said third conductive layer, and said first insulating layer, second insulating layer and third insulating layer disposed between said first conductive layer and said third conductive layer form a first capacitor; said first conductive layer, said fourth conductive layer, and said first insulating layer, second insulating layer and third insulating layer disposed between said first conductive layer and said fourth conductive layer form a second capacitor; said second conductive layer, said third conductive layer, and said third insulating layer disposed between said second conductive layer and said third conductive layer form a third capacitor; said second conductive layer, said fourth conductive layer, and said third insulating layer disposed between said second conductive layer and said fourth conductive layer form a fourth capacitor.

In one embodiment, said method further comprises electrically connecting said first conductive layer to said second conductive layer.

In one embodiment, said method further comprises forming a first via hole penetrating said first insulating layer, said second insulating layer and said third insulating layer to reach said first conductive layer, and a second via hole penetrating said third insulating layer to reach said second conductive layer; and forming a relay conductive layer on said third insulating layer, which is isolated from said third conductive layer and said fourth conductive layer and covers and fills said first via hole and second via hole.

In one embodiment, said method further comprises forming a fourth insulating layer covering said third insulating layer, said third conductive layer and said fourth conductive layer; and forming a fifth conductive layer on said fourth insulating layer, wherein said fifth conductive layer, said third conductive layer, and said fourth insulating layer that is between said fifth conductive layer and said third conductive layer form a fifth capacitor; and said fifth conductive layer, said fourth conductive layer, and said fourth insulating layer that is between said fifth conductive layer and said fourth conductive layer form a sixth capacitor.

In one embodiment, said method further comprises electrically connecting at least one of the first conductive layer and the second conductive layer to the fifth conductive layer.

In one embodiment, said method further comprises forming at least one of the first via hole penetrating said first insulating layer, said second insulating layer and said third insulating layer to reach said first conductive layer, and the second via hole penetrating said third insulating layer to reach said second conductive layer; forming, on said third insulating layer, a relay conductive layer that is isolated from said third conductive layer and said fourth conductive layer and covers and fills said formed via holes; forming a third via hole penetrating said fourth insulating layer to reach said relay conductive layer; and forming the fifth conductive layer to cover and fill said third via hole.

In one embodiment, said fifth conductive layer comprises an ITO layer or an Al Layer.

BRIEF DESCRIPTION OF THE DRAWINGS

In order to describe technical solutions in the embodiments of the present disclosure more clearly, figures of the embodiments will be briefly introduced below. Apparently, the figures described below only relate to some of the embodiments of the present disclosure and they do not intend to limit the present disclosure.

DETAILED DESCRIPTION

Figure 1:
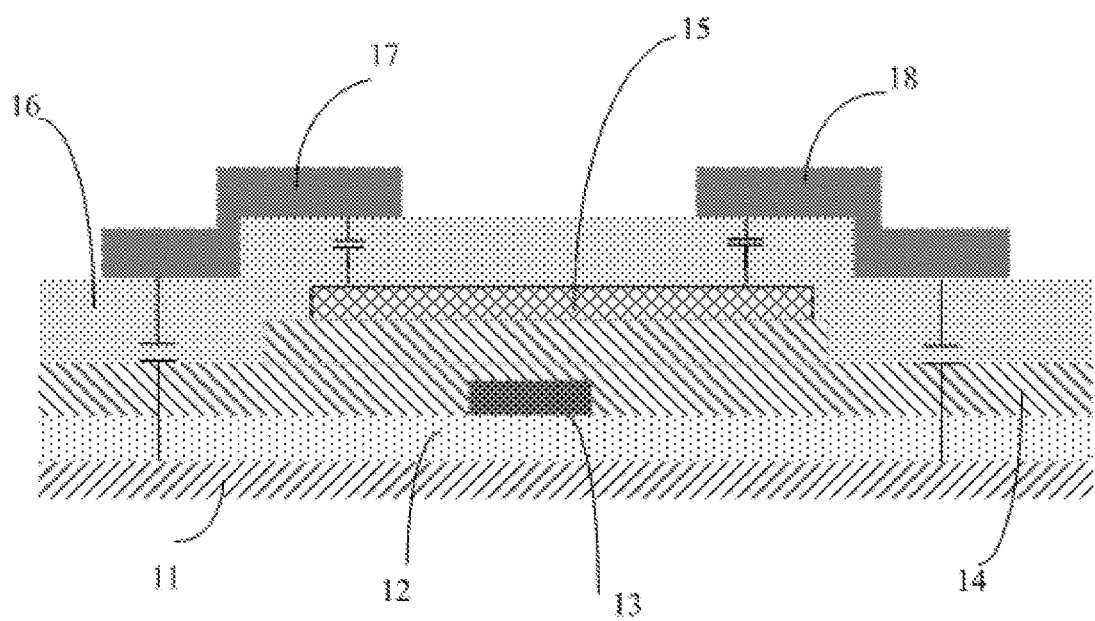
FIG. 1 is a sectional view of an electrostatic discharge device in an embodiment of the present disclosure.

To further clarify the object, technical solutions and advantages of the embodiments of the present disclosure, a clearer and more complete description of the technical solutions in the embodiments of the present disclosure will be rendered with reference to the drawings. Obviously, the described embodiments are merely some instead of all of the embodiments of the present disclosure. All other embodiments that can be obtained by those skilled in the art on the basis of the described embodiments in the present disclosure without using inventive skills shall fall into the protection scope of the present disclosure.

When introducing elements of the present disclosure and embodiments thereof, words "a", "an", "the" and "said" mean that there are one or more elements, and the wordings "include", "comprise", "contain" and "have" do not intend to be exclusive, but they mean that other elements than those listed may also be present.

For the sake of description, as indicated in the drawings, the terms "on", "under", "left", "right", "vertical", "horizontal", "top", "bottom" and their derivatives shall relate to the invention. The terms "cover", "on top of . . . ", "located on . . . " or "located on top of . . . " mean that an element of, for example, a first structure is present on a second element of, for example, a second structure, wherein an intermediate element such as an interface structure may be present between the first element and the second element. The term "contact" means connecting an element of, for example, a first structure to a second element of, for example, a second structure, while other elements may or may not be present at the interface between the two elements.

Unless otherwise specified explicitly in the context, singular forms of words used herein and in the appended claims also include the plural forms, and vice versa. Therefore, when a singular form is mentioned, a plural form of the corresponding term is usually included. Likewise, the wordings "include" and "comprise shall be interpreted as non-exclusive inclusion, unless such interpretation is explicitly forbidden in the text. When the word "example" is used, especially after a group of terms, said "example" is merely exemplary and illustrative, but it shall not be considered as being exclusive and comprehensive.

Preferred embodiments of the present disclosure will be described in detail below with reference to the drawings.

Figure 2:
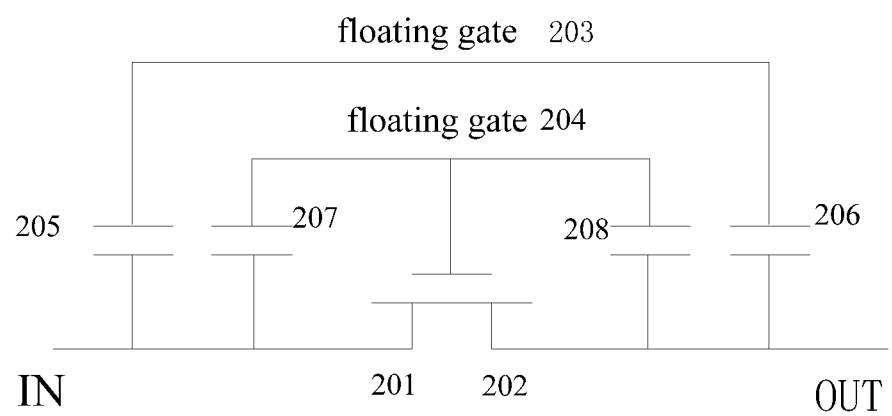
FIG. 2 is a circuit principle diagram corresponding to FIG. 1.

FIG. 1 is a sectional view of an electrostatic discharge device in an embodiment of the present disclosure, and FIG. 2 is a circuit principle diagram corresponding to FIG. 1.

As shown in FIGS. 1 and 2, the electrostatic discharge device comprises a transistor with one of its source 201 and drain 202 serving as an input terminal IN of said electrostatic discharge device and the other of its source 201 and drain 202 serving as an output terminal OUT of said electrostatic discharge device. Said transistor comprises: a first conductive layer 11 used as a first floating gate 203; a first insulating layer 12 covering said first conductive layer; an active layer 13 disposed on said first insulating layer 12; a second insulating layer 14 covering said active layer 13; a second conductive layer 15 used as a second floating gate 204 and disposed on said second insulating layer 14; a third insulating layer 16 covering said second conductive layer 15; and a third conductive layer 17 and a fourth conductive layer 18 isolated from each other which are disposed on said third insulating layer 16 and on both sides of the active layer 13 respectively. Said third conductive layer 17 serves as one of the source 201 and the drain 202, and said fourth conductive 18 serves as the other of the source 201 and the drain 202. Said first conductive layer 11, said third conductive layer 17 and said first insulating layer 12, second insulating layer 14 and third insulating layer 16 disposed between said first conductive layer 11 and said third conductive layer 17 form a first capacitor 205; said first conductive layer 11, said fourth conductive layer 18 and said first insulating layer 12, second insulating layer 14 and third insulating layer 16 disposed between said first conductive layer 11 and said fourth conductive layer 18 form a second capacitor 206; said second conductive layer 15, said third conductive layer 17 and said third insulating layer 16 disposed between said second conductive layer 15 and said third conductive layer 17 form a third capacitor 207; said second conductive layer 15, said fourth conductive layer 18 and said third insulating layer disposed 16 between said second conductive layer 15 and said fourth conductive layer 18 form a fourth capacitor 208.

In said embodiment, the first floating gate 203 and the second floating gate 204 overlap in an up and down direction, and each of said floating gates forms overlap capacitors with the source 201 and the drain 202 respectively so as to form four capacitors. Therefore, when a high voltage static electricity is generated, potentials of the floating gates will be pulled up by the four overlap capacitors, thus turning on the transistor so as to connect the input terminal and the output terminal. In this case, the high voltage static electricity can be released to the output terminal to avoid causing any damage. Since this embodiment uses a structure having four overlap capacitors, areas occupied by the capacitors can be saved and electrostatic discharge speed can be increased.

Figure 3:
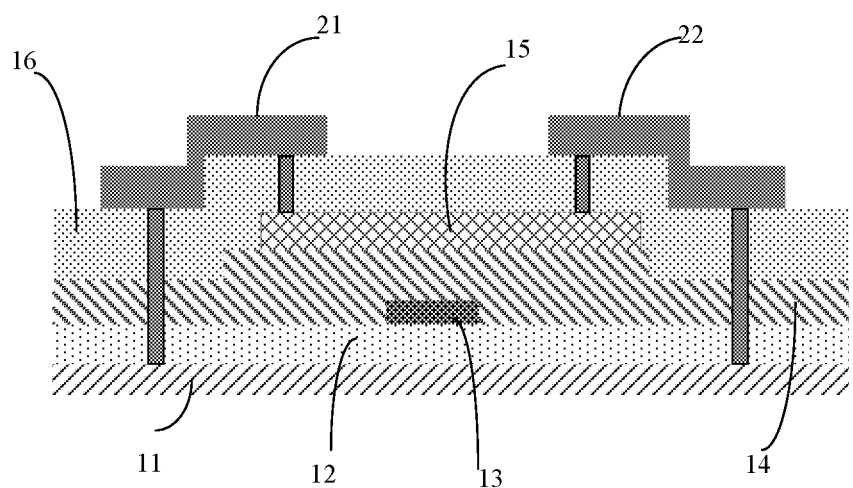
FIG. 3 is a sectional view of an electrical connecting point under the condition that the first conductive layer and the second conductive layer are electrically connected in another embodiment of the present disclosure.
Figure 4:
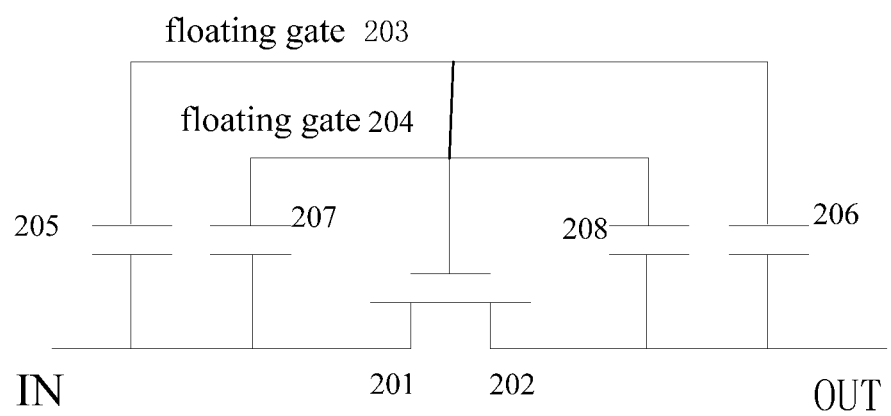
FIG. 4 is a circuit principle diagram corresponding to FIG. 3.

FIG. 3 is a sectional view of an electrical connecting point under the condition that the first conductive layer and the second conductive layer are electrically connected in another embodiment of the present disclosure, and FIG. 4 is a circuit principle diagram corresponding to FIG. 3.

As shown in FIG. 3, the transistor includes a relay conductive layer 21, 22 on the third insulating layer 16 and isolated from the third conductive layer 17 and the fourth conductive layer 18, and the first conductive layer 11 and the second conductive layer 15 are electrically connected to the relay conductive layer 21, 22 through corresponding via holes, so that the first conductive layer 11 and the second conductive layer 15 are electrically connected.

Therefore, as shown in FIG. 4, since the first floating gate 203 formed by the first conductive layer 11 is made to be electrically connected to the second floating gate 204 formed by the second conductive layer 15, the electrostatic discharge speed can be further increased. In addition, the relay conductive layer 21, 22 on the third insulating layer 16 and isolated from the third conductive layer 17 and the fourth conductive layer 18 is used to electrically connect the first conductive layer 11 and the second conductive layer 15, so by forming and separating a conductive layer on the third insulating layer 16, it can function as the source, drain and relay conductive layer respectively, thereby simplifying the structure and reducing the manufacturing cost.

Figure 5:
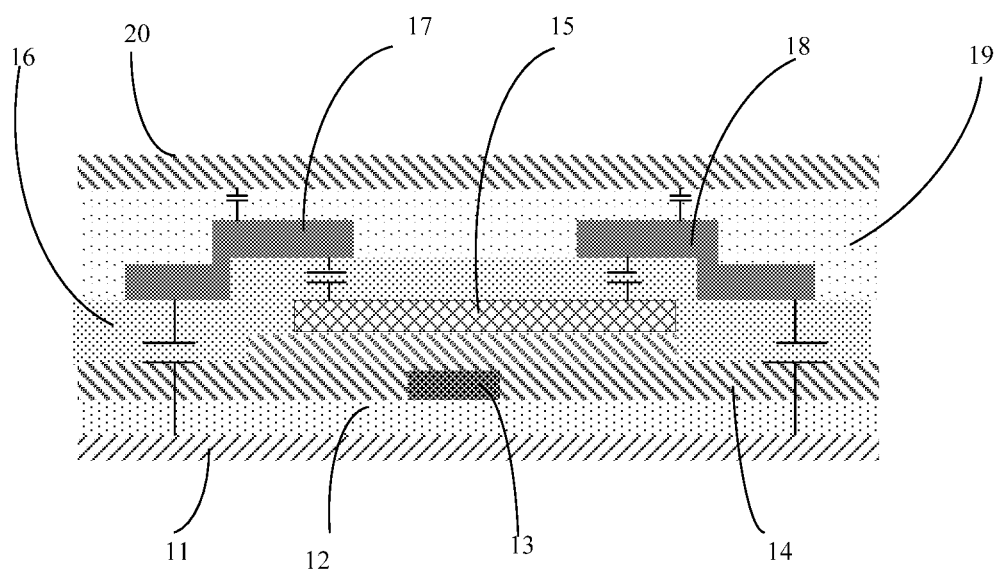
FIG. 5 is a sectional view of an electrostatic discharge device in an embodiment of the present disclosure.
Figure 6:
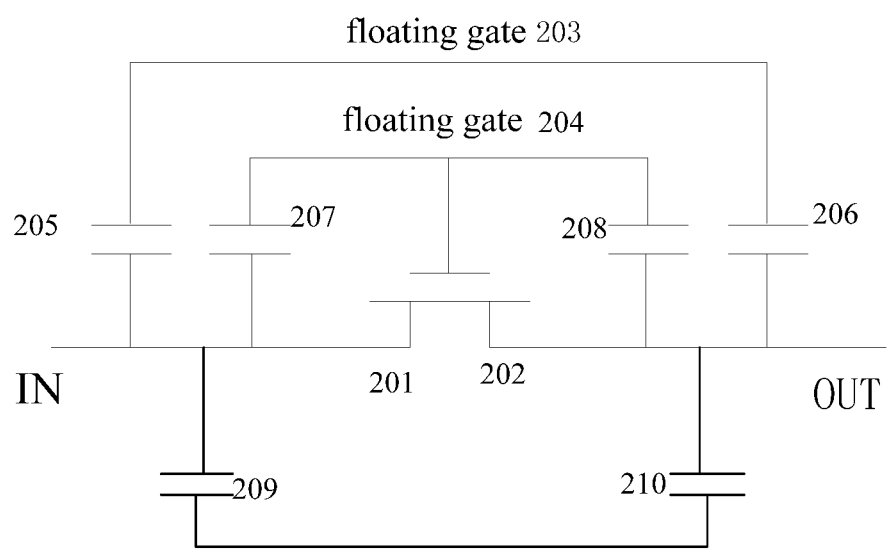
FIG. 6 is a circuit principle diagram corresponding to FIG. 5.

FIG. 5 is a sectional view of an electrostatic discharge device in another embodiment of the present disclosure, and FIG. 6 is a circuit principle diagram corresponding to FIG. 5.

As shown in FIGS. 5 and 6, the transistor further includes a fourth insulating layer 19 covering the third insulating layer 16, the third conductive layer 17 and the fourth conductive layer 18, and a fifth conductive layer 20 on the fourth insulating layer 19, wherein the fifth conductive layer 20, the third conductive layer 17 and the fourth insulating layer 19 disposed therebetween form a fifth capacitor 209, and the fifth conductive 20, the fourth conductive layer 18 and the fourth insulating layer 19 disposed therebetween form a sixth capacitor 210.

In said another embodiment, since capacitors 209, 210 are formed respectively between the fifth conductive layer 20 and the third conductive layer 17 and fourth conductive layer 18 that serve as the source and drain respectively, the areas occupied by the capacitors are greatly reduced and the electrostatic discharge speed is further increased.

FIGS. 7-12 are sectional views of electrical connecting points between at least one of the first conductive layer 11 and second conductive layer 15 and the fifth conductive layer 20 as well as the corresponding circuit principle diagrams.

Figure 7:
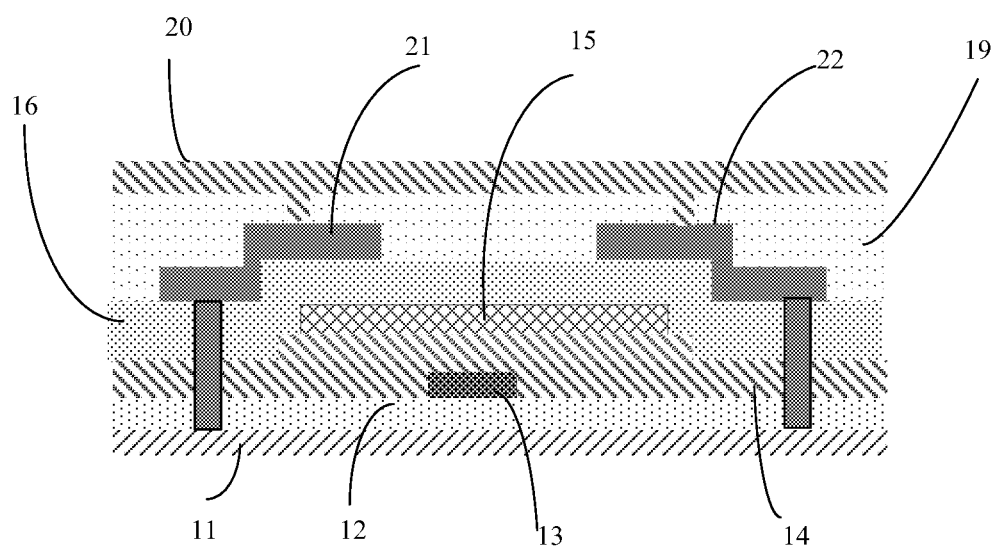
FIG. 7 is a sectional view of an electrical connecting point under the condition that the first conductive layer and the fifth conductive layer are electrically connected in another embodiment of the present disclosure.
Figure 8:
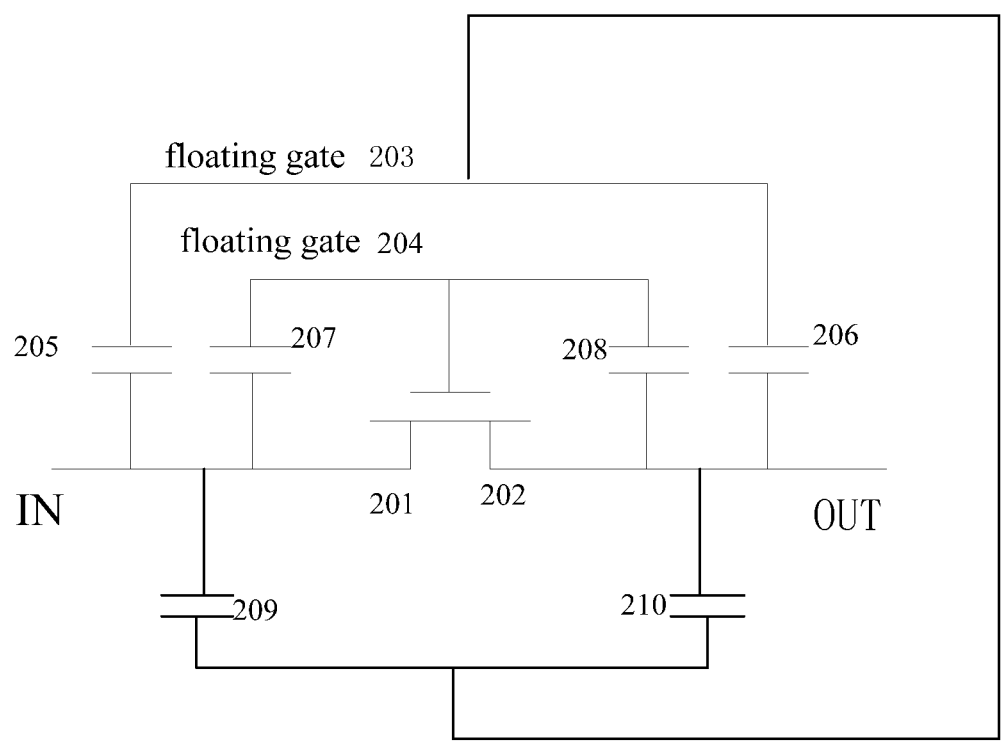
FIG. 8 is a circuit principle diagram corresponding to FIG. 7.
Figure 9:
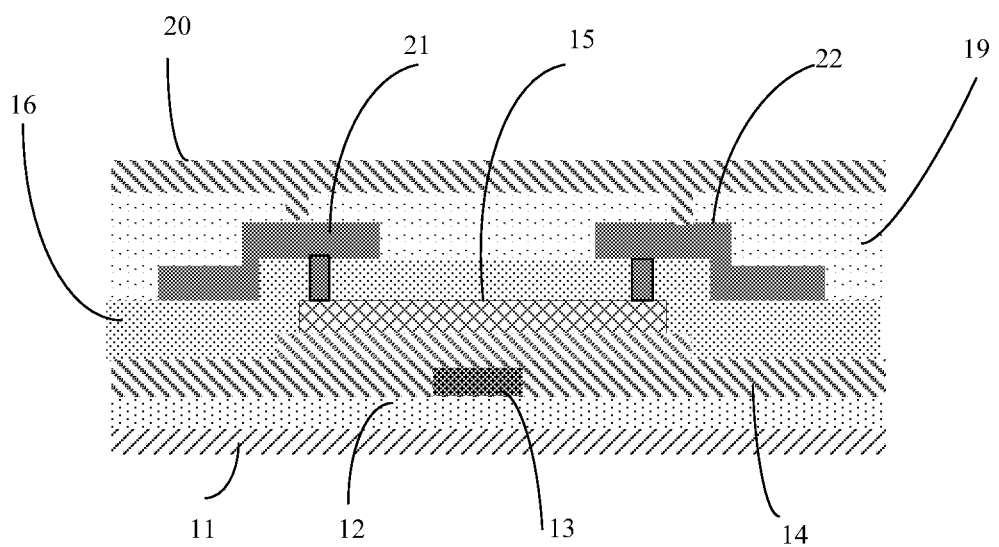
FIG. 9 is a sectional view of an electrical connecting point under the condition that the second conductive layer and the fifth conductive layer are electrically connected in still another embodiment of the present disclosure.
Figure 10:
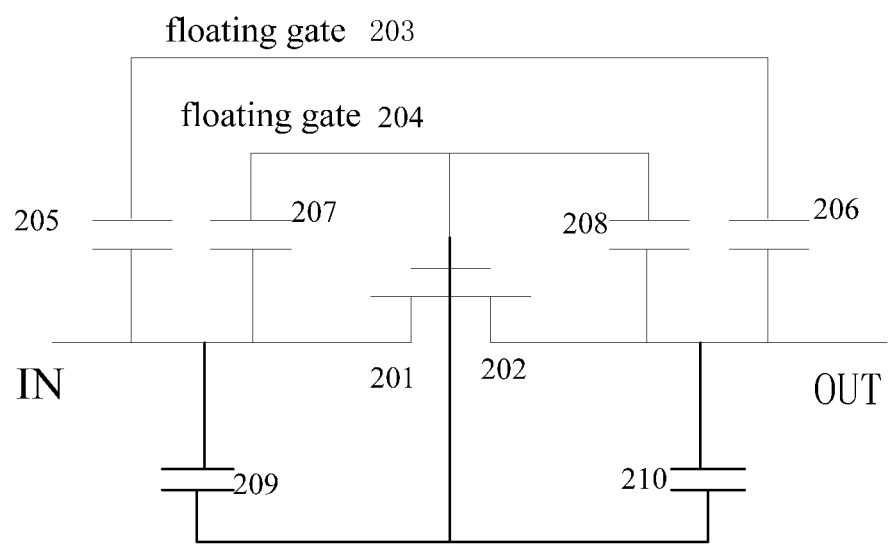
FIG. 10 is a circuit principle diagram corresponding to FIG. 9.
Figure 11:
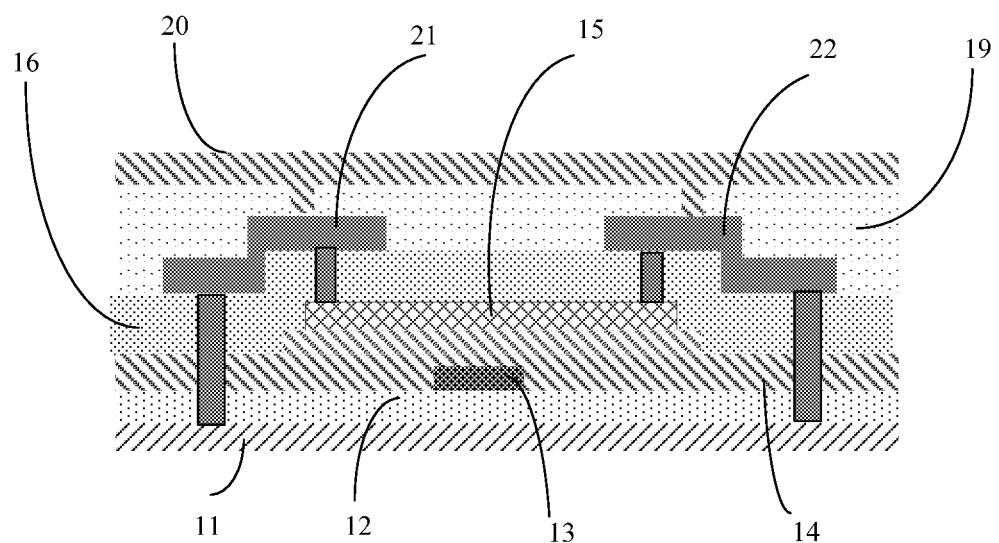
FIG. 11 is a sectional view of an electrical connecting point under the condition that the first conductive layer, the second conductive layer and the fifth conductive layer are all electrically connected in an embodiment of the present disclosure.
Figure 12:
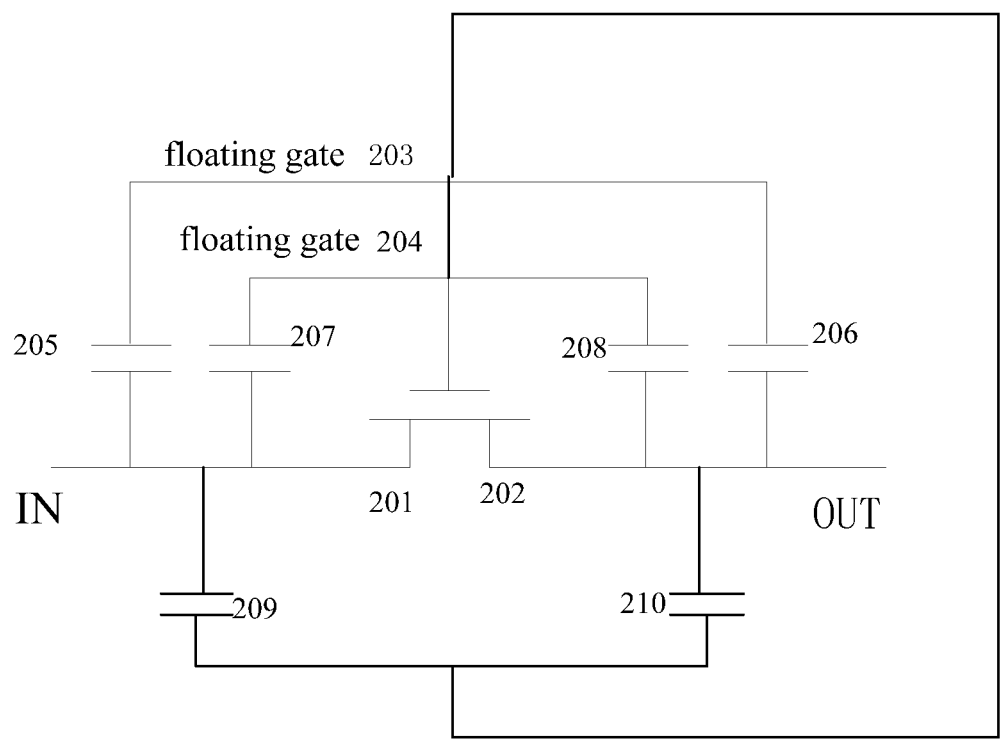
FIG. 12 is a circuit principle diagram corresponding to FIG. 11.

Specifically, FIG. 7 is a sectional view of an electrical connecting point under the condition that the first conductive layer and the fifth conductive layer are electrically connected in another embodiment of the present disclosure. FIG. 8 is a circuit principle diagram corresponding to FIG. 7. FIG. 9 is a sectional view of an electrical connecting point under the condition that the second conductive layer and the fifth conductive layer are electrically connected in still another embodiment of the present disclosure, and FIG. 10 is a circuit principle diagram corresponding to FIG. 9. FIG. 11 is a sectional view of an electrical connecting point under the condition that the first conductive layer, the second conductive layer and the fifth conductive layer are all electrically connected in one embodiment of the present disclosure, and FIG. 12 is a circuit principle diagram corresponding to FIG. 11.

As shown in FIG. 7, the transistor includes: a relay conductive layer 21, 22 on the third insulating layer 16 and isolated from the third conductive layer 17 and the fourth conductive layer 18, and the first conductive layer 11 and the fifth conductive layer 20 are electrically connected to the relay conductive layer 21, 22 through corresponding via holes.

Therefore, as shown in FIG. 8, since the first floating gate 203 is made to be electrically connected to the fifth conductive layer 20, the electrostatic discharge speed can be further increased. In addition, the relay conductive layer 21, 22 on the third insulating layer 16 and isolated from the third conductive layer 17 and the fourth conductive layer 18 is used to electrically connect the first conductive layer 11 and the fifth conductive layer 20, so by forming and separating a conductive layer on the third insulating layer 16, it can function as the source, drain and relay conductive layer, thereby simplifying the structure and reducing the manufacturing cost.

As shown in FIG. 9, the transistor includes: a relay conductive layer 21, 22 on the third insulating layer 16 and isolated from the third conductive layer 17 and the fourth conductive layer 18, and the second conductive layer 15 and the fifth conductive layer 20 are electrically connected to the relay conductive layer 21, 22 through corresponding via holes.

Therefore, as shown in FIG. 10, since the second floating gate 204 is made to be electrically connected to the fifth conductive layer 20, the electrostatic discharge speed can be further increased. In addition, the relay conductive layer 21, 22 on the third insulating layer 16 and isolated from the third conductive layer 17 and the fourth conductive layer 18 is used to electrically connect the second conductive layer 15 and the fifth conductive layer 20, so by forming and separating a conductive layer on the third insulating layer 16, it can function as the source, drain and relay conductive layer, thereby simplifying the structure and reducing the manufacturing cost.

As shown in FIG. 11, the transistor includes: a relay conductive layer 21, 22 on the third insulating layer 16 and isolated from the third conductive layer 17 and the fourth conductive layer 18, and the first conductive layer 11, the second conductive layer 15 and the fifth conductive layer 20 are electrically connected to the relay conductive layer 21, 22 through corresponding via holes.

Therefore, as shown in FIG. 12, since the first floating gate 203 and the second floating gate 204 are both made to be electrically connected to the fifth conductive layer 20, the electrostatic discharge speed can be further increased. In addition, the relay conductive layer 21, 22 on the third insulating layer 16 and isolated from the third conductive layer 17 and the fourth conductive layer 18 is used to electrically connect the first conductive layer 11, the second conductive layer 15 and the fifth conductive layer 20, so by forming and separating a conductive layer on the third insulating layer 16, it can function as the source, drain and relay conductive layer, thereby simplifying the structure and reducing the manufacturing cost.

Furthermore, the fifth conductive layer 20 may include an ITO layer or an Al layer.

By making the fifth conductive layer to include the ITO layer or Al layer, it can be appropriately applied to transmissive display or reflective display.

Figure 13:
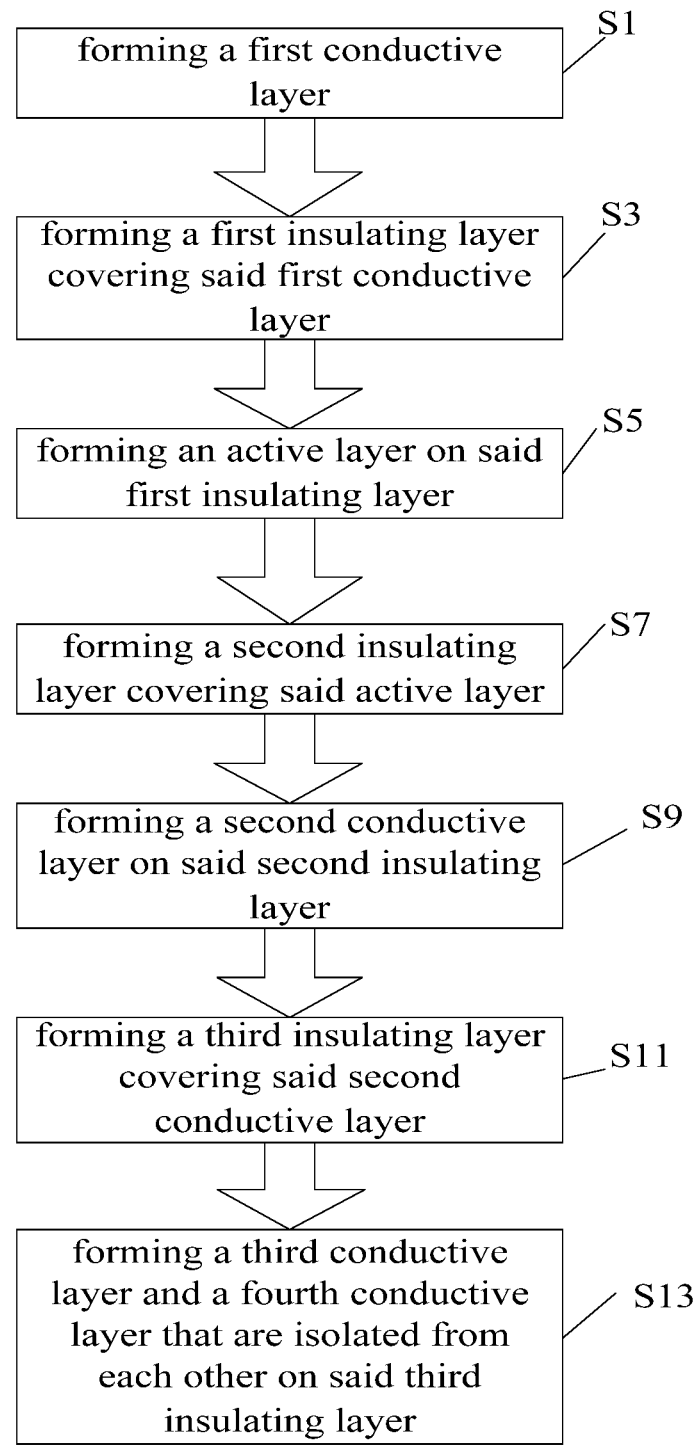
FIG. 13 is a flow chart of a method of manufacturing the electrostatic discharge device in an embodiment of the present disclosure.

FIG. 13 is a flow chart of a manufacturing method of the electrostatic discharge device in an embodiment of the present disclosure.

As shown in FIG. 13, the manufacturing method of the electrostatic discharge device as provided in an embodiment of the present disclosure comprises: S1: forming a first conductive layer used as a first floating gate; S3: forming a first insulating layer covering said first conductive layer; S5: forming an active layer on said first insulating layer; S7: forming a second insulating layer covering said active layer; S9: forming a second conductive layer used as a second floating gate on said second insulating layer; S11: forming a third insulating layer covering said second conductive layer; and S13: forming a third conductive layer and a fourth conductive layer that are isolated from each other on said third insulating layer.

Said third conductive layer and fourth conductive layer are on both sides of the active layer, respectively, said third conductive layer serves as one of the source and the drain of the transistor, and said fourth conductive layer serves as the other of the source and the drain, wherein said first conductive layer, said third conductive layer, and said first insulating layer, second insulating layer and third insulating layer disposed between said first conductive layer and said third conductive layer form a first capacitor; said first conductive layer, said fourth conductive layer, and said first insulating layer, second insulating layer and third insulating layer disposed between said first conductive layer and said fourth conductive layer form a second capacitor; said second conductive layer, said third conductive layer and said third insulating layer disposed between said second conductive layer and said third conductive layer form a third capacitor; said second conductive layer, said fourth conductive layer and said third insulating layer disposed between said second conductive layer and said fourth conductive layer form a fourth capacitor.

In the manufacturing method of the electrostatic discharge device in said embodiment, the first conductive layer that serves as the first floating gate and the second conductive layer that serves as the second floating gate are made to overlap in an up and down direction, and each of said two conductive layers forms overlap capacitors with the third conductive layer and the fourth conductive layer respectively that serve as the source and the drain so as to form four capacitors, so by means of said manufacturing method, an electrostatic discharge device having four overlap capacitors and with reduced area occupation of the capacitors and increased electrostatic discharge speed can be manufactured.

Further, said method may comprise electrically connecting the first conductive layer to the second conductive layer. Said method may further comprise forming a first via hole penetrating said first insulating layer, said second insulating layer and said third insulating layer to reach said first conductive layer, and a second via hole penetrating said third insulating layer to reach said second conductive layer; and forming a relay conductive layer on said third insulating layer, which is isolated from said third conductive layer and said fourth conductive layer and covers and fills said first via hole and second via hole.

By electrically connecting the first conductive layer to the second conductive layer, the electrostatic discharge speed can be further increased. In addition, by using the relay conductive layer on the third insulating layer and isolated from the third conductive layer and the fourth conductive layer to electrically connect the first conductive layer and the second conductive layer through corresponding via holes, the manufacturing process can be simplified and the manufacturing cost can be reduced.

Figure 14:
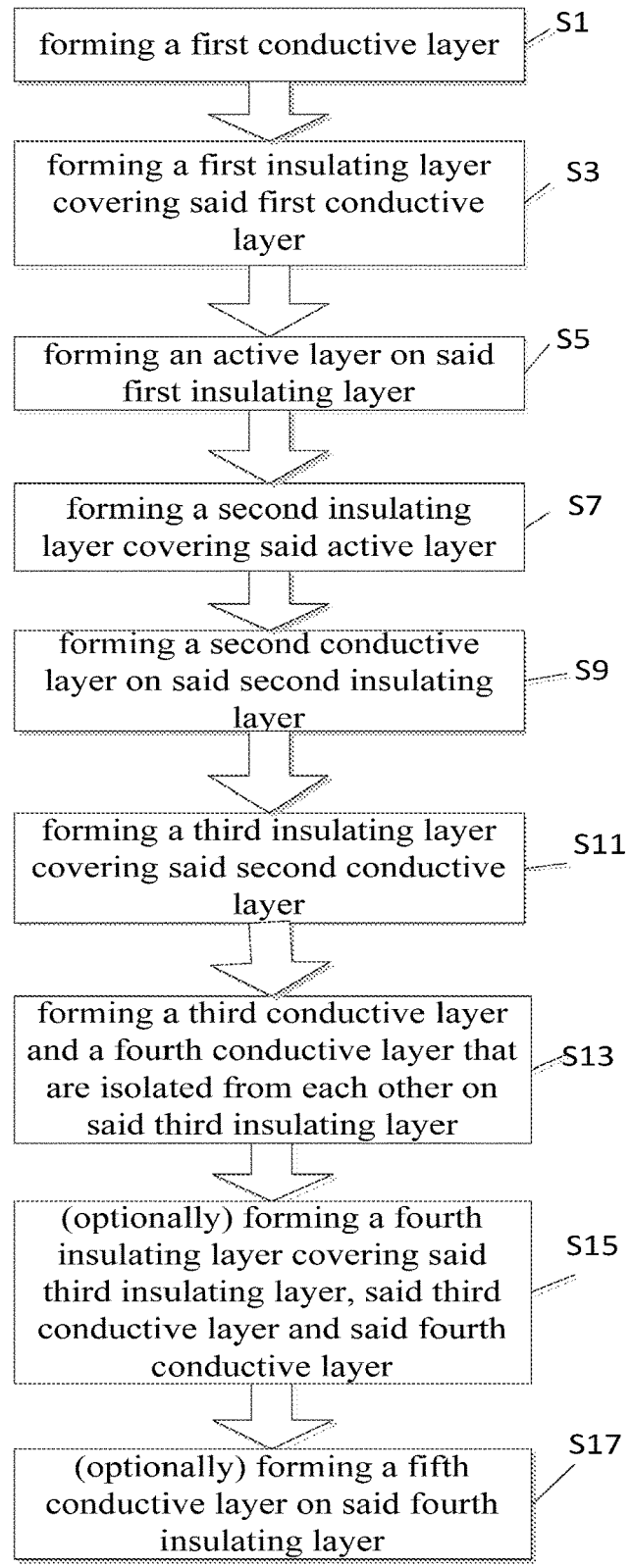
FIG. 14 is a flow chart of a method of manufacturing the electrostatic discharge device in another embodiment of the present disclosure.

FIG. 14 is a flow chart of a manufacturing method of the electrostatic discharge device in another embodiment of the present disclosure.

As shown in FIG. 14, the manufacturing method of the electrostatic discharge device in another embodiment of the present disclosure comprises: S1: forming a first conductive layer used as a first floating gate; S3: forming a first insulating layer covering said first conductive layer; S5: forming an active layer on said first insulating layer; S7: forming a second insulating layer covering said active layer; S9: forming a second conductive layer used as a second floating gate on said second insulating layer; S11: forming a third insulating layer covering said second conductive layer; and S13: forming a third conductive layer and a fourth conductive layer that are isolated from each other on said third insulating layer; S15: forming a fourth insulating layer covering said third insulating layer, said third conductive layer and said fourth conductive layer; and S17: forming a fifth conductive layer on said fourth insulating layer.

Said third conductive layer and fourth conductive layer are on both sides of the active layer, respectively. Said third conductive layer serves as one of the source and the drain of the transistor, and said fourth conductive layer serves as the other of the source and the drain. Said first conductive layer, said third conductive layer, and said first insulating layer, second insulating layer and third insulating layer disposed between said first conductive layer and said third conductive layer form a first capacitor; said first conductive layer, said fourth conductive layer, and said first insulating layer, second insulating layer and third insulating layer disposed between said first conductive layer and said fourth conductive layer form a second capacitor; said second conductive layer, said third conductive layer, and said third insulating layer disposed between said second conductive layer and said third conductive layer form a third capacitor; said second conductive layer, said fourth conductive layer, and said third insulating layer disposed between said second conductive layer and said fourth conductive layer form a fourth capacitor; said fifth conductive layer, said third conductive layer, and said fourth insulating layer disposed between said fifth conductive layer and said third conductive layer form a fifth capacitor; and said fifth conductive layer, said fourth conductive layer, and said fourth insulating layer disposed between said fifth conductive layer and said fourth conductive layer form a sixth capacitor.

In the manufacturing method of the electrostatic discharge device in said another embodiment, the first conductive layer that serves as the first floating gate, the second conductive layer that serves as the second floating gate, and the fifth conductive layer are made to overlap in an up and down direction, and each of said three conductive layers forms overlap capacitors with the third conductive layer and the fourth conductive layer respectively that serve as the source and the drain so as to form six capacitors, so by means of said manufacturing method, an electrostatic discharge device having six overlap capacitors and with reduced area occupation of the capacitors and increased electrostatic discharge speed can be manufactured.

Further, said method may comprise electrically connecting at least one of the first conductive layer and the second conductive layer to the fifth conductive layer. Said method may further comprise forming at least one of a first via hole penetrating said first insulating layer, said second insulating layer and said third insulating layer to reach said first conductive layer and a second via hole penetrating said third insulating layer to reach said second conductive layer; forming, on said third insulating layer, a relay conductive layer that is isolated from said third conductive layer and said fourth conductive layer and covers and fills said formed via holes; forming a third via hole penetrating said fourth insulating layer to reach said relay conductive layer; and forming the fifth conductive layer to cover and fill said third via hole.

By electrically connecting at least one of the first conductive layer and the second conductive layer to the fifth conductive layer, the electrostatic discharge speed can be further increased. In addition, by using the relay conductive layer on the third insulating layer and isolated from the third conductive layer and the fourth conductive layer to electrically connect at least one of the first conductive layer and the second conductive layer to the fifth conductive layer through corresponding via holes, the manufacturing process can be simplified and the manufacturing cost can be reduced.

In addition, the fifth conductive layer may include an ITO layer or an Al layer. By making the fifth conductive layer to include the ITO layer or Al layer, it can be appropriately applied to transmissive display or reflective display.

An embodiment of the present disclosure further provides an active array substrate, wherein said active array substrate has the above-mentioned electrostatic discharge device. In said active array substrate, an input terminal of the electrostatic discharge device can be connected to a gate line or a data line, and an output terminal of the electrostatic discharge device can be grounded.

By making the input terminal of the electrostatic discharge device to be the gate line or data line, the display area can be protected from static electricity more reliably.

An embodiment of the present disclosure further provides a display panel, wherein said display panel has the above-mentioned active array substrate.

An embodiment of the present disclosure further provides a display device, wherein said display device has the above-mentioned display panel.

Although the specific embodiments of the present disclosure have been described in detail by means of some examples, said embodiments do not mean to be exhaustive, and those skilled in the art can realize various changes and modifications within the spirit and scope of the present disclosure. Therefore, the present disclosure is not limited to these embodiments, but the scope thereof further covers variations and improvements made on the basis of the inventive concept of the present disclosure.

The invention claimed is:

1. An electrostatic discharge device, comprising: a transistor with one of its source and drain serving as an input terminal of said electrostatic discharge device and the other of its source and drain serving as an output terminal of said electrostatic discharge device,
   wherein said transistor comprises:
   a first conductive layer used as a first floating gate;
   a first insulating layer covering said first conductive layer;

an active layer disposed on said first insulating layer;
a second insulating layer covering said active layer;
a second conductive layer used as a second floating gate and disposed on said second insulating layer;
a third insulating layer covering said second conductive layer; and
a third conductive layer and a fourth conductive layer disposed on said third insulating layer and on both sides of the active layer, said third conductive layer and fourth conductive layer being isolated from each other;
wherein said third conductive layer serves as one of the source and the drain and said fourth conductive layer serves as the other of the source and the drain;
said first conductive layer, said third conductive layer, and said first insulating layer, second insulating layer and third insulating layer disposed between said first conductive layer and said third conductive layer form a first capacitor;
said first conductive layer, said fourth conductive layer, and said first insulating layer, second insulating layer and third insulating layer disposed between said first conductive layer and said fourth conductive layer form a second capacitor;
said second conductive layer, said third conductive layer, and said third insulating layer disposed between said second conductive layer and said third conductive layer form a third capacitor;
said second conductive layer, said fourth conductive layer, and said third insulating layer disposed between said second conductive layer and said fourth conductive layer form a fourth capacitor.

2. The electrostatic discharge device according to claim 1, wherein
said first conductive layer and said second conductive layer are electrically connected to each other.

3. The electrostatic discharge device according to claim 2, wherein
said transistor further comprises: a relay conductive layer disposed on said third insulating layer and isolated from said third conductive layer and said fourth conductive layer, and
wherein said first conductive layer and said second conductive layer are electrically connected to said relay conductive layer through corresponding via holes.

4. The electrostatic discharge device according to claim 1, wherein said transistor further comprises:
a fourth insulating layer covering said third insulating layer, said third conductive layer and said fourth conductive layer; and
a fifth conductive layer disposed on said fourth insulating layer;
wherein said fifth conductive layer, said third conductive layer and said fourth insulating layer that is disposed between said fifth conductive layer and said third conductive layer form a fifth capacitor;
said fifth conductive layer, said fourth conductive layer and said fourth insulating layer that is disposed between said fifth conductive layer and said fourth conductive layer form a sixth capacitor.

5. The electrostatic discharge device according to claim 4, wherein
at least one of said first conductive layer and said second conductive layer is electrically connected to said fifth conductive layer.

6. The electrostatic discharge device according to claim 5, wherein
said transistor further comprises: a relay conductive layer disposed on said third insulating layer and isolated from said third conductive layer and said fourth conductive layer;
said fifth conductive layer and at least one of said first conductive layer and said second conductive layer are electrically connected to said relay conductive layer through corresponding via holes.

7. The electrostatic discharge device according to claim 4, wherein said fifth conductive layer comprises an ITO layer or an Al layer.

8. An active array substrate comprising the electrostatic discharge device according to claim 1.

9. The active array substrate according to claim 8, wherein the input terminal of said electrostatic discharge device is connected to a gate line or a data line, and the output terminal of said electrostatic discharge device is grounded.

10. A display panel comprising the active array substrate according to claim 8.

11. A display device comprising the display panel according to claim 10.

12. A method for manufacturing an electrostatic discharge device, wherein said electrostatic discharge device comprises a transistor with one of its source and drain serving as an input terminal of said electrostatic discharge device and the other of its source and drain serving as an output terminal of said electrostatic discharge device, said method comprises:
forming a first conductive layer used as a first floating gate;
forming a first insulating layer covering said first conductive layer;
forming an active layer on said first insulating layer;
forming a second insulating layer covering said active layer;
forming a second conductive layer used as a second floating gate on said second insulating layer;
forming a third insulating layer covering said second conductive layer; and
forming a third conductive layer and a fourth conductive layer that are isolated from each other on said third insulating layer;
wherein said third conductive layer and fourth conductive layer are on both sides of the active layer, respectively, said third conductive layer serves as one of the source and the drain and said fourth conductive layer serves as the other of the source and the drain;
wherein said first conductive layer, said third conductive layer, and said first insulating layer, second insulating layer and third insulating layer disposed between said first conductive layer and said third conductive layer form a first capacitor;
said first conductive layer, said fourth conductive layer, and said first insulating layer, second insulating layer and third insulating layer disposed between said first conductive layer and said fourth conductive layer form a second capacitor;
said second conductive layer, said third conductive layer, and said third insulating layer disposed between said second conductive layer and said third conductive layer form a third capacitor;
said second conductive layer, said fourth conductive layer, and said third insulating layer disposed between said second conductive layer and said fourth conductive layer form a fourth capacitor.

13. The method according to claim 12, further comprising electrically connecting said first conductive layer to said second conductive layer.

14. The method according to claim 13, further comprising:
- forming a first via hole penetrating said first insulating layer, said second insulating layer and said third insulating layer to reach said first conductive layer, and a second via hole penetrating said third insulating layer to reach said second conductive layer; and
- forming a relay conductive layer on said third insulating layer, which is isolated from said third conductive layer and said fourth conductive layer and covers and fills said first via hole and second via hole.

15. The method according to claim 12, further comprising:
- forming a fourth insulating layer covering said third insulating layer, said third conductive layer and said fourth conductive layer; and
- forming a fifth conductive layer on said fourth insulating layer,
- wherein said fifth conductive layer, said third conductive layer, and said fourth insulating layer that is between said fifth conductive layer and said third conductive layer form a fifth capacitor;
- said fifth conductive layer, said fourth conductive layer and said fourth insulating layer that is between said fifth conductive layer and said fourth conductive layer form a sixth capacitor.

16. The method according to claim 15, further comprising:
- electrically connecting at least one of the first conductive layer and the second conductive layer to the fifth conductive layer.

17. The method according to claim 16, further comprising:
- forming at least one of the first via hole penetrating said first insulating layer, said second insulating layer and said third insulating layer to reach said first conductive layer, and the second via hole penetrating said third insulating layer to reach said second conductive layer;
- forming, on said third insulating layer, a relay conductive layer that is isolated from said third conductive layer and said fourth conductive layer and covers and fills said formed via holes;
- forming a third via hole penetrating said fourth insulating layer to reach said relay conductive layer; and
- forming the fifth conductive layer to cover and fill said third via hole.

18. The method according to claim 15, wherein
said fifth conductive layer comprises an ITO layer or an Al Layer.

19. A display panel comprising the active array substrate according to claim 9.

20. A display device comprising the display panel according to claim 19.

* * * * *